United States Patent
Nah

(10) Patent No.: US 9,721,919 B2
(45) Date of Patent: Aug. 1, 2017

(54) SOLDER BUMPS FORMED ON WAFERS USING PREFORMED SOLDER BALLS WITH DIFFERENT COMPOSITIONS AND SIZES

(71) Applicant: International Business Machines Corporation, Armonk, NY (US)

(72) Inventor: Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/967,610

(22) Filed: Dec. 14, 2015

(65) Prior Publication Data

US 2017/0170140 A1 Jun. 15, 2017

(51) Int. Cl.
*H01L 21/00* (2006.01)
*H01L 23/00* (2006.01)

(52) U.S. Cl.
CPC .............. *H01L 24/81* (2013.01); *H01L 24/09* (2013.01); *H01L 24/11* (2013.01); *H01L 24/17* (2013.01); *H01L 2224/1147* (2013.01); *H01L 2224/11334* (2013.01); *H01L 2224/11849* (2013.01); *H01L 2224/13147* (2013.01); *H01L 2224/1403* (2013.01); *H01L 2224/14505* (2013.01); *H01L 2224/81948* (2013.01)

(58) Field of Classification Search
None
See application file for complete search history.

(56) References Cited

U.S. PATENT DOCUMENTS

| 3,719,981 | A | * | 3/1973 | Steitz | .............. H01L 24/11 228/123.1 |
|---|---|---|---|---|---|
| 4,830,264 | A | | 5/1989 | Bitaillou et al. | |
| 5,219,117 | A | | 6/1993 | Lin | |
| 5,620,927 | A | | 4/1997 | Lee | |
| 5,844,316 | A | | 12/1998 | Mallik et al. | |

(Continued)

OTHER PUBLICATIONS

J.-W. Nah et al., "Electromigration in Pb-Free Solder Bumps with Cu Column as Flip Chip Joints," Proceedings of the IEEE 56th Electronic Components and Technology Conference (ECTC), May/Jun. 2006, pp. 547-662.

(Continued)

*Primary Examiner* — David E Graybill
(74) *Attorney, Agent, or Firm* — Daniel P. Morris; Ryan, Mason & Lewis, LLP

(57) ABSTRACT

Solder-bumped semiconductor substrates (e.g., semiconductor wafers) and methods for forming solder bumped semiconductor substrates are provided, in which solder bumps are formed on a semiconductor substrate using preformed solder balls having different compositions and/or sizes. Two or more solder balls masks are successively utilized to place different types of preformed solder balls (differing in composition and/or size) into corresponding cavities of a solder ball fixture, and thereby form an array of different types of preformed solder balls arranged in the solder ball fixture. The array of preformed solder balls in the solder ball fixture are then transferred to corresponding contact pads of a semiconductor substrate (e.g., semiconductor wafer) using a single solder reflow process. This process allows different types of preformed solder bumps to be bonded to a semiconductor substrate at the same time using a single solder reflow process.

7 Claims, 12 Drawing Sheets

(56) References Cited

U.S. PATENT DOCUMENTS

| | | | |
|---|---|---|---|
| 5,899,737 A | 5/1999 | Trabucco | |
| 6,213,386 B1 | 4/2001 | Inoue et al. | |
| 6,229,210 B1 | 5/2001 | Casey | |
| 6,321,972 B1* | 11/2001 | May | B23K 3/0623 228/246 |
| 6,571,007 B1 | 5/2003 | Shimokawa et al. | |
| 6,855,623 B2 | 2/2005 | Ball | |
| 6,919,634 B2* | 7/2005 | Kuramoto | H01L 21/4853 257/738 |
| 7,185,799 B2 | 3/2007 | Pearson et al. | |
| 7,314,817 B2 | 1/2008 | Dias et al. | |
| 7,507,655 B2* | 3/2009 | Sakaguchi | B23K 3/0623 257/E21.508 |
| 7,780,063 B2* | 8/2010 | Budd | B23K 1/0016 228/180.22 |
| 8,148,255 B2* | 4/2012 | Dang | B23K 1/0016 257/E21.575 |
| 8,541,291 B2* | 9/2013 | Furman | H01L 21/563 438/108 |
| 8,912,045 B2 | 12/2014 | Dang et al. | |
| 9,082,754 B2* | 7/2015 | Gruber | H01L 23/48 |
| 2002/0192936 A1* | 12/2002 | Ball | H01L 21/4853 438/613 |
| 2003/0047527 A1* | 3/2003 | Master | H05K 3/3478 211/41.18 |
| 2003/0141342 A1* | 7/2003 | Kurata | B22F 1/0048 228/56.3 |
| 2004/0053488 A1* | 3/2004 | Anzai | H01L 24/11 438/613 |
| 2007/0234563 A1* | 10/2007 | Sakaguchi | B23K 3/0623 29/843 |
| 2008/0003805 A1* | 1/2008 | Pang | H01L 24/11 438/613 |
| 2008/0182398 A1* | 7/2008 | Carpenter | H01L 23/13 438/612 |
| 2009/0004840 A1* | 1/2009 | Farinelli | H01L 24/11 438/616 |
| 2013/0327811 A1 | 12/2013 | Dang et al. | |
| 2014/0035150 A1* | 2/2014 | Gruber | B23K 3/0623 257/772 |
| 2015/0318251 A1* | 11/2015 | Gruber | B23K 3/0623 438/614 |

OTHER PUBLICATIONS

F. Ren et al., "In-Situ Study of the Effect of Electromigration on Strain Evolution and Mechanical Property Change in Lead-Free Solder Joints," Proceedings of the 56th Electronic Components and Technology Conference, May/Jun. 2006, pp. 1160-1163.

Tom Debonis, "Getting the Lead Out," Intel, Assembly & Test Technology Development Technology and Manufacturing Group, Dec. 2007, 20 pages.

H. Ran et al., "Thermal Characterization of Copper Contact Interconnect for DRAM Package Stacking in Memory-Intensive Consumer Applications," Advancing Microelectronics, Nov./Dec. 2007, pp. 10-14.

I. Shohji et al., "Growth Kinetics of Reaction Layers in Flip Chip Joints with Cu-Cored Lead-Free Solder Balls," Materials Transactions, Jan. 2004, pp. 754-758, vol. 45, No. 3.

Hitachi Metals, Ltd., "Manual Micro-Ball Mounter Developed," http://www.hitachi-metals.co.jp/e/press/news/2005/n0928.htm, Sep. 28, 2006, 9 pages.

electroiq.com, "Solder Ball Transfer for Flip Chip and WLCSP," Solid State Technology, Insights for Electronics Manufacturing, http://electroiq.com/blog/2008/03/solder-ball-transfer-for-flip-chip-and-wlcsp/, Mar. 17, 2008, 3 pages.

* cited by examiner

SOLDER BUMPS FORMED ON WAFERS USING PREFORMED SOLDER BALLS WITH DIFFERENT COMPOSITIONS AND SIZES

TECHNICAL FIELD

This disclosure generally relates to semiconductor fabrication techniques and, in particular, techniques for forming solder bumps on semiconductor wafers using preformed solder balls.

BACKGROUND

State of the art microelectronic devices are typically packaged by using solder bumps as the method of interconnection. For example, in wafer scale packaging, various solder bumping techniques have been developed to form solder bumps on semiconductor wafers or package substrates with fine pitch. These solder bumping techniques include, for example, solder ball placement techniques in which preformed solder balls are directly placed on, and bonded to, an array of bonding pads which are formed on a surface of the wafer. Existing techniques for forming solder-bumped wafers using preformed solder balls are only capable of forming solder bumps on wafer bond pads using preformed solder balls that are the same in volume and composition.

SUMMARY

Embodiments of the invention generally include solder-bumped semiconductor substrates (e.g., semiconductor wafers) and methods for forming solder bumped semiconductor substrates using preformed solder balls having different compositions and/or sizes.

For example, one embodiment of the invention includes a method to form solder bumps on a substrate. The method includes placing a first solder ball mask on a solder ball fixture, wherein the solder ball fixture comprises a first array of cavities and a second array of cavities formed in a surface of the solder ball fixture, and wherein the first solder ball mask comprises a first array of openings aligned to the first array of cavities of the solder ball fixture. The first solder ball mask is utilized to place a first type of preformed solder balls into the first array of cavities through the first array of openings, wherein the first solder ball mask prevents the first type of preformed solder balls from being placed into the second array of cavities of the solder ball fixture. The first solder ball mask is removed from the solder ball fixture, and a second solder ball mask is placed on the solder ball fixture, wherein the second solder ball mask comprises a second array of openings aligned to the second array of cavities of the solder ball fixture. The second solder ball mask is utilized to place a second type of preformed solder balls into the second array of cavities through the second array of openings. The second solder ball mask is removed from the solder ball fixture, and a substrate is placed on the solder ball fixture. The substrate comprises a first array of contact pads aligned to, and in contact with, the first type of preformed solder balls disposed in the first array of cavities of the solder ball fixture. The substrate comprises a second array of contact pads aligned to, and in contact with, the second type of preformed solder balls disposed in the second array of cavities of the solder ball fixture. The preformed solder balls are heated (via a solder reflow process) to bond the first type of preformed solder balls to the first array of contact pads of the substrate and to bond the second type of preformed solder balls to the second array of contact pads of the substrate.

In one embodiment of the invention, the first and second types of preformed solder balls differ in size (e.g., volume). In another embodiment, the first and second types of preformed solder balls differ in composition.

Another embodiment of the invention includes a substrate. The substrate includes a first array of contact pads having a first type of preformed solder balls bonded thereto, and a second array of contact pads having a second type of preformed solder balls bonded thereto. The first type of preformed solder balls have a first composition type, and the second type of preformed solder balls have a second composition type, wherein the first and second composition types are different.

Other embodiments will be described in the following detailed description of embodiments, which is to be read in conjunction with the accompanying figures.

BRIEF DESCRIPTION OF THE DRAWINGS

FIGS. 1-11 schematically illustrate a method to form solder bumps on a substrate using preformed solder balls having different sizes (and optionally different compositions), according to an embodiment of the invention, wherein:

FIG. 1 schematically illustrates an initial stage of the solder bump formation process wherein a first solder ball mask is aligned to a solder ball fixture;

FIG. 2 schematically illustrates a next stage in the solder bump formation process wherein the first solder ball mask is placed on top of the solder ball fixture and utilized to place smaller preformed solder balls into a first array of cavities of the solder ball fixture;

FIG. 3 schematically illustrates a next stage in the solder bump formation process wherein the first solder ball mask is removed from the surface of the solder ball fixture;

FIG. 4 schematically illustrates a next stage in the solder bump formation process wherein a second solder ball mask is aligned to the solder ball fixture;

FIG. 5 schematically illustrates a next stage in the solder bump formation process wherein the second solder ball mask is placed on top of the solder ball fixture and utilized to place larger preformed solder balls into a second array of cavities of the solder ball fixture;

FIG. 6 schematically illustrates a next stage in the solder bump formation process wherein the second solder ball mask is removed from the surface of the solder ball fixture;

FIGS. 7 and 8 schematically illustrate an alternate embodiment of the steps of FIGS. 4 and 5, wherein a second solder ball mask comprises partially etched regions to provide room for the upper portions of the smaller preformed solder balls which extend past the surface of the solder ball fixture to thereby allow the second solder ball mask to lay flat on the solder ball fixture;

FIG. 9 schematically illustrates a next stage in the solder bump formation process wherein a first array of contact pads and a second array of contact pads of a semiconductor substrate are aligned to the respective arrays of smaller and larger preformed solder balls in the solder ball fixture;

FIG. 10 schematically illustrates a next stage in the solder bump formation process wherein the semiconductor substrate is placed on top of the solder ball fixture with the contact pads in contact with corresponding preformed solder balls to begin a solder reflow process; and FIG. 11 schematically illustrates a next stage in the solder bump formation process following a solder reflow process wherein the solder ball fixture is removed from the semiconductor substrate with the preformed solder balls bonded to the respective contact pads of the semiconductor substrate, thereby forming a solder-bumped substrate.

FIGS. 12, 13 and 14 schematically illustrate a flip-chip bonding process which can be implemented to bond an individual die, which is diced from the solder bumped substrate of FIG. 11, to a package substrate, wherein:

FIG. 12 schematically illustrates an initial step of the flip-chip bonding process in which the individual die comprises a plurality of the solder bumps aligned to respective bonding sites on the package substrate;

FIG. 13 schematically illustrates a next step of the flip-chip bonding process in which the solder bumps of the individual die are heated and reflowed using a standard reflow process to bond to the respective bonding sites on the package substrate and form interconnects between the die and the package substrate; and FIG. 14 schematically illustrates a next step of the flip-chip bonding process in which an underfill material is inserted into the spaces between the die and the package substrate.

FIGS. 15-21 schematically illustrate a method to form solder bumps on a substrate using preformed solder balls having different compositions, according to another embodiment of the invention, wherein:

FIG. 15 schematically illustrates an initial stage of the solder bump formation process wherein a first solder ball mask is aligned to a solder ball fixture;

FIG. 16 schematically illustrates a next stage in the solder bump formation process wherein the first solder ball mask is placed on top of the solder ball fixture and utilized to place preformed solder balls of a first composition type into a first array of cavities of the solder ball fixture;

FIG. 17 schematically illustrates a next stage in the solder bump formation process wherein the first solder ball mask is removed from the surface of the solder ball fixture, and a second solder ball mask is aligned to, and placed on, the solder ball fixture;

FIG. 18 schematically illustrates a next stage in the solder bump formation process wherein the second solder ball mask is utilized to place preformed solder balls of a second composition type into a second array of cavities of the solder ball fixture;

FIG. 19 schematically illustrates a next stage in the solder bump formation process wherein a first array of contact pads and a second array of contact pads of a semiconductor substrate are aligned to the respective arrays of the first and second composition types of the preformed solder balls in the solder ball fixture;

FIG. 20 schematically illustrates a next stage in the solder bump formation process wherein the semiconductor substrate is placed on top of the solder ball fixture with the contact pads in contact with corresponding preformed solder balls to begin a solder reflow process; and FIG. 21 schematically illustrates a next stage in the solder bump formation process following a solder reflow process wherein the solder ball fixture is removed from the semiconductor substrate with the preformed solder balls bonded to the respective contact pads of the semiconductor substrate, thereby forming a solder-bumped substrate.

FIGS. 22, 23, and 24 schematically illustrate a flip-chip bonding process which can be implemented to bond an individual die, which is diced from the solder bumped substrate of FIG. 21, to a package substrate, wherein:

FIG. 22 schematically illustrates an initial step of the flip-chip bonding process in which the individual die comprises a plurality of the solder bumps aligned to respective bonding sites on the package substrate;

FIG. 23 schematically illustrates a next step of the flip-chip bonding process in which the solder bumps of the individual die are heated and reflowed using a standard reflow process to bond to the respective bonding sites on the package substrate and form interconnects between the die and the package substrate; and FIG. 24 schematically illustrates a next step of the flip-chip bonding process in which an underfill material is inserted into the spaces between the die and the package substrate.

DETAILED DESCRIPTION OF EMBODIMENTS

Figure 1:
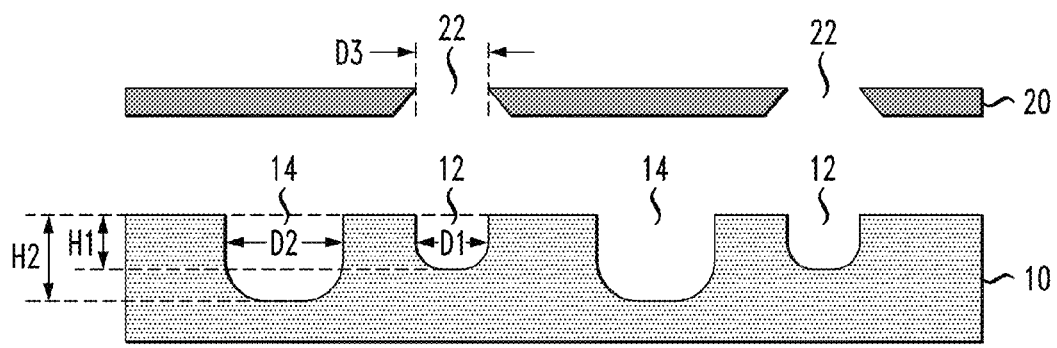

Embodiments of the invention will now be discussed in further detail with regard solder-bumped semiconductor substrates (e.g., semiconductor wafers) and methods for forming solder bumped semiconductor substrates using preformed solder balls having different compositions and/or sizes. As explained in further detail below, two or more solder balls masks are successively utilized to place different types of preformed solder balls (differing in composition and/or size) into corresponding cavities of a solder ball fixture, and thereby form an array of different types of preformed solder balls arranged in the solder ball fixture. The array of different types of preformed solder balls in the solder ball fixture are then transferred to corresponding contact pads of a semiconductor substrate (e.g., semiconductor wafer) using a single solder reflow process. This process allows different types of preformed solder bumps to be bonded to a semiconductor substrate at the same time using a single solder reflow process. The use of different sizes and/or different compositions of solder bumps on a semiconductor wafer or a wafer-scale substrate enable the formation of flip-chip connections that are custom designed to provide, e.g., improved electromigration reliability and mechanical reliability for a given application.

It is to be understood that the various components, structures and regions shown in the accompanying drawings are schematic illustrations that are not drawn to scale. In addition, for ease of explanation, one or more components, structures, and regions of a type commonly used to form semiconductor devices or structures may not be explicitly shown in a given drawing. This does not imply that any of such components, structures, and regions not explicitly shown in the drawings are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIGS. 1-11 schematically illustrate a method to form solder bumps on a substrate (e.g., a semiconductor wafer or some other wafer-scale substrate) using preformed solder balls having different sizes (and optionally different compositions), according to an embodiment of the invention. FIG. 1 schematically illustrates an initial stage of the process wherein a first solder ball mask 20 is aligned to a solder ball fixture 10. The solder ball fixture 10 comprises a planar substrate having an array of different size cavities 12 and 14 formed in a surface of the substrate to temporarily hold different sizes of preformed solder balls. As shown in FIG. 1, the cavities 12 have a diameter D1 and depth H1, and the cavities 14 have a diameter D2 and depth H2, wherein D1<D2 and H1<H2. The first solder ball mask 20 comprises an array of openings 22 (or through holes) which correspond to the smaller cavities 12 of the solder ball fixture 10. The openings 22 shown in FIG. 1 have slanted sidewalls, forming v-shaped openings 22 with a smallest diameter D3. The diameter D3 is greater than D1 but less than D2.

The solder ball fixture 10 can be formed of a semiconductor material such as silicon, or formed of glass, or any other suitable material. The cavities 12 and 14 are etched using suitable techniques depending on the material of the fixture 10. For a glass fixture, the cavities 12 and 14 are formed round-shaped, as shown in FIG. 1. For a silicon fixture, the cavities 12 and 14 would be formed v-shaped. The first solder ball mask 20 can be formed of a metallic or polymer material, wherein the openings 22 are formed/etched using suitable techniques.

Figure 2:
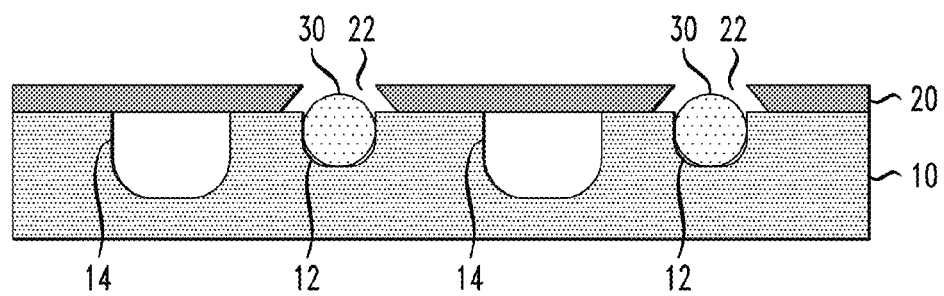

FIG. 2 schematically illustrates a next stage in the solder bump formation process according to an embodiment of the invention, wherein the first solder ball mask 20 is placed on the solder ball fixture 10 with the openings 22 aligned to the smaller cavities 12, and wherein preformed solder balls 30 are placed into the cavities 12 through the openings 22 of the first solder ball mask 20. More specifically, in one embodiment of the invention, the solder ball fixture 10 is held in place using, e.g., a vacuum chuck, and the first solder ball mask 20 is placed within a movable retaining frame, wherein the retaining frame is moved in X, Y and Z directions to place the first solder ball mask 20 on top of the solder ball fixture 10 with the array of openings 22 aligned to the array of smaller cavities 12. The alignment can be implemented using automated or semi-automated techniques, which are the same or similar to those used in standard pick and place alignment tools, for example.

After alignment of the solder ball fixture 10 and the first solder ball mask 20, a plurality of preformed solder balls 30 are placed on top of the first solder ball mask 20. The preformed solder balls 30 are moved back and forth across the surface of the first solder ball mask 20 using, for example, a brush, vibrational motion, or other suitable techniques, so that the preformed solder balls 30 fall through the openings 22 of the first solder ball mask 20 into the cavities 12 of the solder ball fixture 10. With this process, the preformed solder balls 30 have a diameter that is slightly less than the diameter D1 of the openings 22 and the diameter D1 of the cavities 12, which allows the preformed solder balls 30 to be drop into the cavities 12 through the openings 22. Moreover, with this process, the first solder ball mask 20 prevents the preformed solder balls 30 from being placed into the second array of cavities 14 of the solder ball fixture 10.

Figure 3:
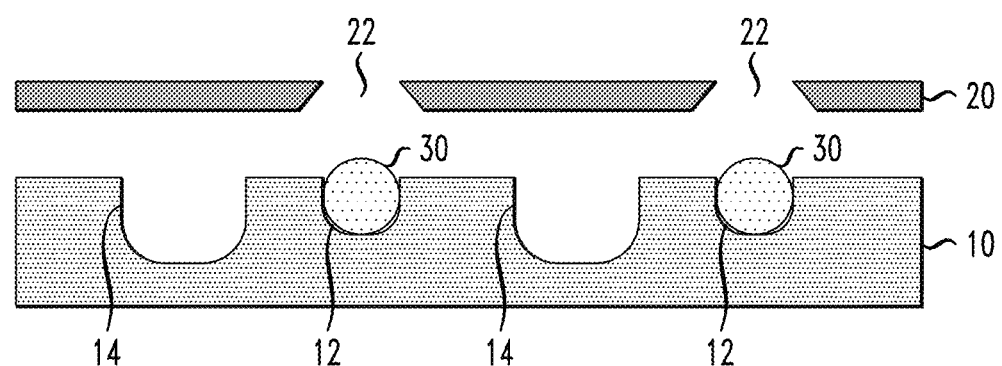

FIG. 3 schematically illustrates a next stage in the solder bump formation process according to an embodiment of the invention, wherein the first solder ball mask 20 is removed from the surface of the solder ball fixture 10, leaving all of the preformed solder balls 30 disposed in the cavities 12. In this process, the wider profile of the bottom portions of the openings 22 of the first solder ball mask 20 provides additional room for the preformed solder balls 30 when placed in the cavities 12, as well as prevent the preformed solder balls 30 from being inadvertently pulled out of the cavities 12 when removing the first solder ball mask 20.

Figure 4:
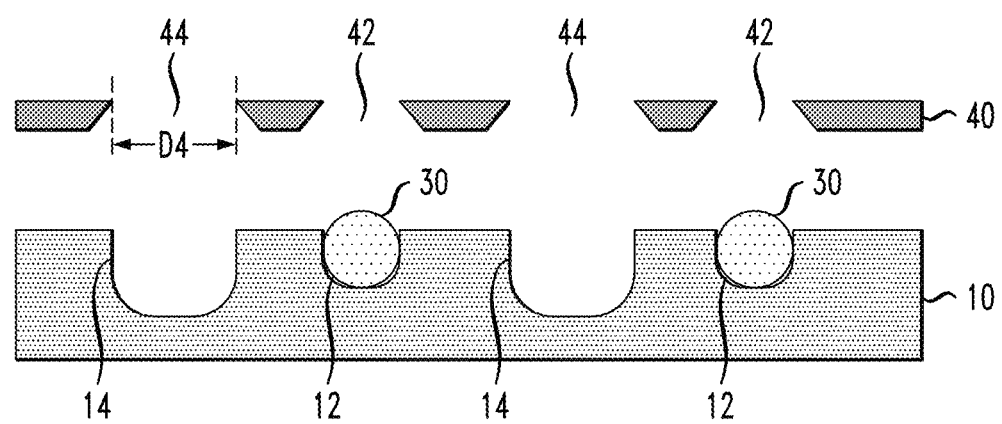

FIG. 4 schematically illustrates a next stage in the solder bump formation process according to an embodiment of the invention, wherein a second solder ball mask 40 is aligned to the solder ball fixture 10. The second solder ball mask 40 is utilized to place larger size preformed solder balls into the array of cavities 14 of the solder ball fixture 10. In particular, as shown in FIG. 4, the second solder ball mask 40 comprises a first array of openings 42 (or through holes) which correspond to the smaller cavities 12 of the solder ball fixture 10, and a second array of openings 44 which correspond to the larger cavities 14 of the solder ball fixture 10. The openings 42 have slanted sidewalls, forming v-shaped openings 42 with a smallest diameter that is the same or similar to the diameter D3 of the openings 22 in the first solder ball mask 20 (FIG. 1). In addition, the openings 44 have slanted sidewalls, forming v-shaped openings 44 with a smallest diameter D4, wherein the diameter D4 is substantially the same or slightly larger than the diameter D2 of the cavities 14 (see FIG. 1), and larger than the diameter D3. The second array of openings 44 allow larger size solder balls to be placed into the larger size cavities 14 of the solder ball fixture 10.

Figure 5:
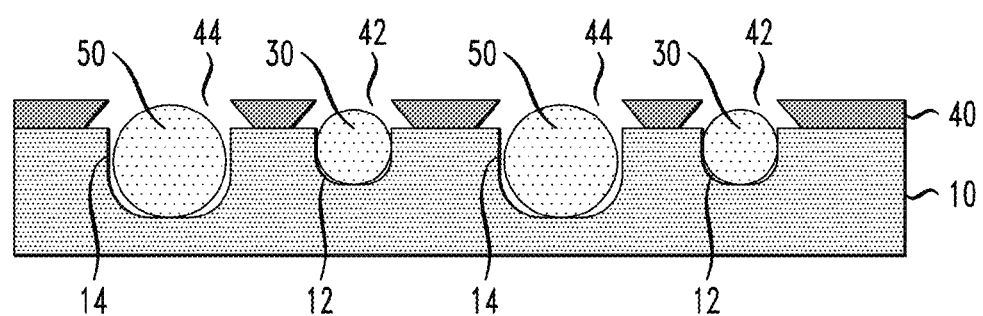

In particular, FIG. 5 schematically illustrates a next stage in the solder bump formation process according to an embodiment of the invention, wherein the second solder ball mask 40 is placed on top of the solder ball fixture 10 and utilized to place larger preformed solder balls 50 into the second array of cavities 14 of the solder ball fixture 10. In this process, the second solder ball mask 40 is placed on top of the solder ball fixture 10 with the larger openings 44 aligned to the larger cavities 14, and with the smaller openings 42 aligned to the smaller cavities 12 which have the preformed solder balls 30 disposed therein. The same techniques as discussed above can be utilized for aligning and holding the second solder ball mask 40 in position on the solder ball fixture 10, and placing the preformed solder balls 50 into the cavities 14 of the solder ball fixture 10. With this process, the preformed solder balls 50 have a diameter that is slightly less than the diameter D4 of the openings 44 and the diameter D2 of the cavities 14 so as to allow the preformed solder balls 50 to drop into the cavities 14 through the openings 44. Moreover, with this process, the larger size preformed solder balls 50 cannot pass through the smaller openings 42 or otherwise fit within the smaller cavities 12. In one embodiment of the invention, the openings 42 in the second solder ball mask 40 are formed to provide room for the upper portions of the preformed solder balls 30 which extend past the surface of the fixture 10, and thereby allow the second solder ball mask 40 to lay flat on the solder ball fixture 10. In addition, the openings 42 provide an inspection window to enable inspection of the fixture 10 and ensure that each cavity 12 includes a preformed solder ball 30.

In one embodiment of the invention, the diameter of the smaller size preformed solder balls 30 is in a range of about 60 microns to about 120 microns, and the diameter of the larger size preformed solder balls 50 is in a range of about 120 microns to about 200 microns. In one embodiment of the invention, the different size preformed solder balls 30 and 50 have the same solder composition. In this embodiment, the smaller size preformed solder balls 30 (with smaller volume) can be utilized for I/O signal connections, while the larger size preformed solder balls 50 (with larger volume) can be utilized for high power/high current density connections. In another embodiment of the invention, the different size preformed solder balls 30 and 50 can have different solder compositions which are optimized for the intended application. For example, some preformed solder balls can have a solder composition that enhances a current carrying capability and reduces electromigration of the solder bump interconnections that are formed using such preformed solder balls, while other preformed solder balls can have a solder composition with greater ductility, which allows for the formation of solder bump interconnections that are more flexible and less prone to be damaged (or cause damage to other package components) due to thermal and mechanical stresses.

By way of specific example, a solder composition of SnAg can be utilized to implement high power/high current density solder bump interconnections, whereas a solder composition of SnCu can be utilized for low power/low current density solder bump interconnections. While SnAg and SnCu solders have similar melting temperatures, a SnAg solder composition shows better electromigration resistance than a SnCu solder composition, but a SnCu solder composition is more ductile than a SnAg solder composition. In this regard, a SnCu solder minimizes the stress of the solder bump interconnections after chip/substrate assembly. For example, if all solder bump interconnections are formed of SnAg solder, a BEOL (back-end-of-line) structure of the chip can be damaged due to the mechanical stress from the SnAg solder bump interconnections. On the other hand, if all of the solder bump interconnections are made using SnCu solder, while the BEOL would be less prone to damage, there is a higher risk of electromigration failure in the SnCu solder bump interconnections that are used for high power/high current density interconnections.

By way of further example, other solder compositions that may be utilized for a given application include SnAgCu solder and SnBi solder. A SnAgCu solder composition is a higher melting temperature solder which can be utilized to form solder bump interconnections for high power/high current density applications. On the other hand, a SnBi solder composition is a lower melting temperature solder which can be utilized to form solder bump interconnections for low power/low current density applications. Higher melting temperature solders typically have better electromigration resistance than lower melting temperature solders.

Figure 6:
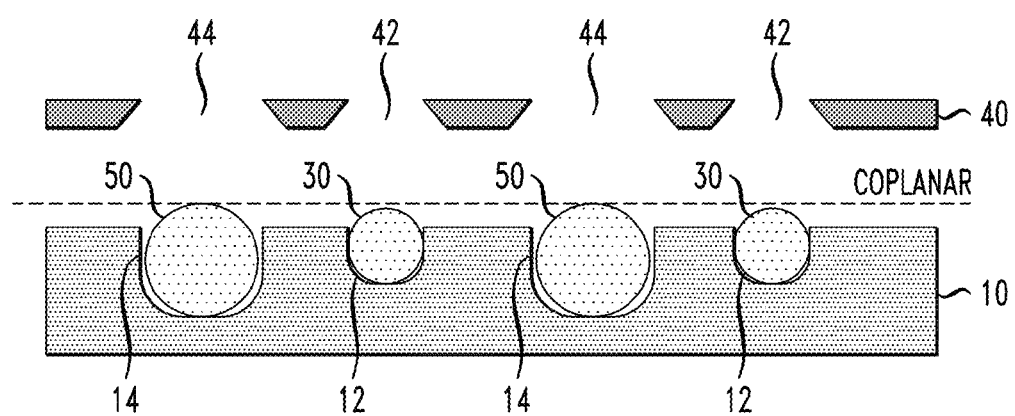

FIG. 6 schematically illustrates a next stage in the solder bump formation process according to an embodiment of the invention, wherein the second solder ball mask 40 is removed from the surface of the solder ball fixture 10, leaving all of the preformed solder balls 30 and 50 disposed in the respective cavities 12 and 14. In this process, the wider profile of the bottom portions of the openings 44 of the second solder ball mask 40 serves to provide additional room for the preformed solder balls 50 that are placed in the cavities 14, and to prevent the preformed solder balls 50 from being inadvertently pulled out of the cavities 14 when removing the second solder ball mask 40. As further shown in FIG. 6, even though different size preformed solder balls 30 and 50 are placed into the fixture 10, the cavities 12 and 14 of the solder ball fixture 10 are dimensioned so that the top portions of the solder balls 30 and 50 across the fixture 10 are coplanar.

Figure 7:
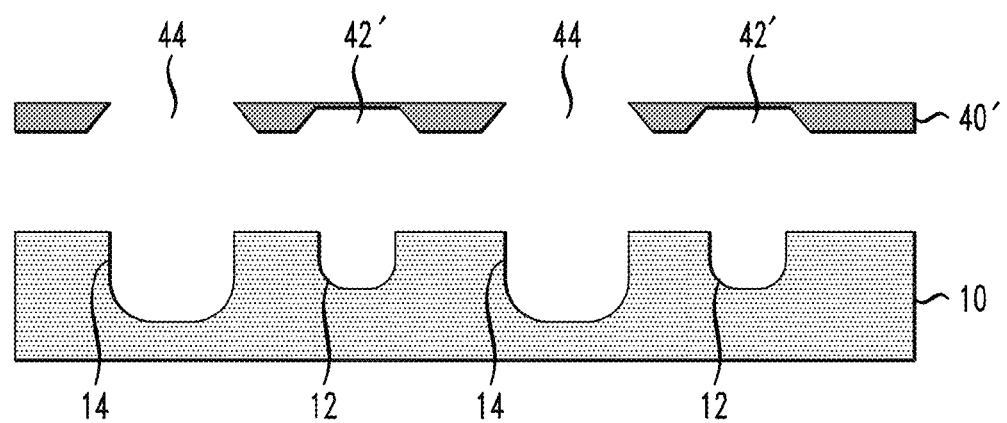
Figure 8:
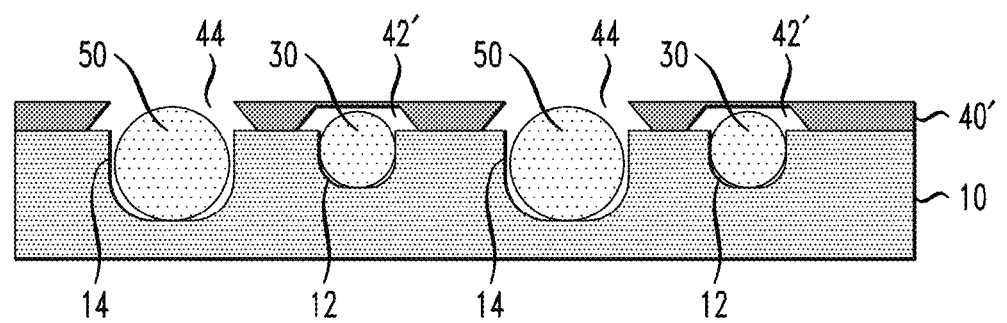

FIGS. 7 and 8 schematically illustrate an alternate embodiment of the method steps of FIGS. 4 and 5, wherein a second solder ball mask 40' is shown having the openings 44 to allow the larger sized solder balls 50 to pass through the openings 44 and be placed into the cavities 14. However, the second solder ball mask 40' comprises partially etched regions 42' (as opposed to through-hole openings 42). The partially etched regions 42' provide room for the upper portions of the preformed solder balls 30 which extend past the surface of the fixture 10, and thereby allow the second solder ball mask 40' to lay flat on the solder ball fixture 10 during placement of the larger size preformed solder balls 50 into the cavities 14 of the solder ball fixture 10.

Figure 9:
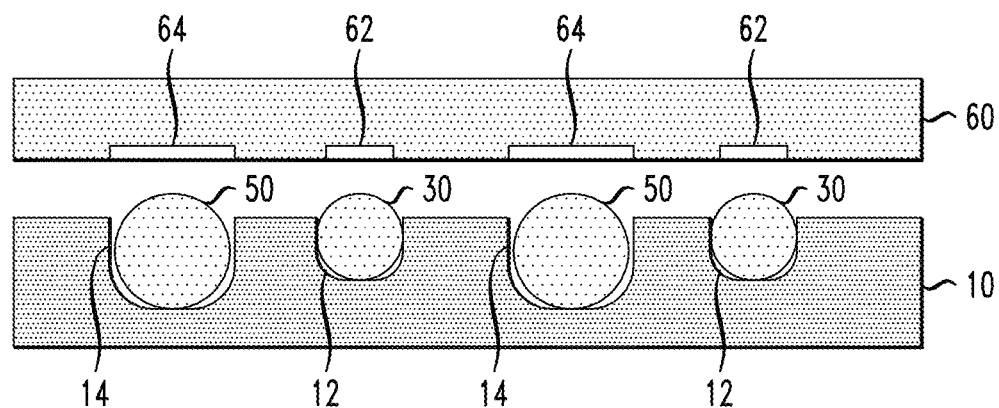
Figure 10:
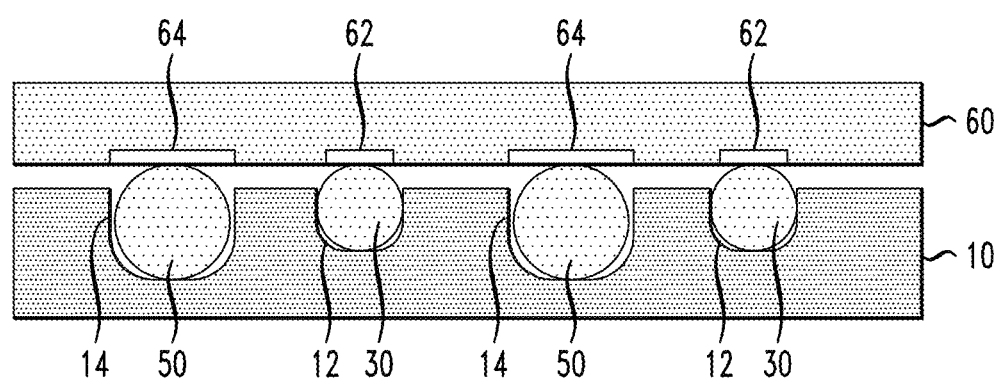

FIG. 9 schematically illustrates a next stage in the solder bump formation process wherein a first array of contact pads 62 and a second array of contact pads 64 of a semiconductor substrate 60 (e.g., silicon wafer, or some other wafer-scale substrate) are aligned to the respective arrays of the smaller preformed solder balls 30 and the larger preformed solder balls 50 arranged in the solder ball fixture 10. In addition, FIG. 10 schematically illustrates a next stage in the solder bump formation process wherein the semiconductor substrate 60 is placed on top of the solder ball fixture 10 with the contact pads 62 and 64 in contact with corresponding preformed solder balls 30 and 50 to begin a solder reflow process. The surface area of each contact pad 64 is larger than the surface area of each contact pad 62. As shown in FIG. 10, the coplanarity of the preformed solder balls 30 and 50 across the array of preformed solder balls arranged in the fixture 10 (as illustrated in FIG. 6) allows the contact pads 62 and 64 of the substrate 60 to made contact to each of the respective solder balls 30 and 50.

In one embodiment of the invention, the contact pads 62 and 64 comprise UBM (under bump metallurgy) structures that are formed using a standard BLM (ball limiting metallurgy) process. With BLM, the contact pads 62 and 64 can be formed to include a layered stack of metallic films using known techniques. For example, the contact pads 62 and 64 can be formed of Ti, Ni, Cu, or Au, or a combination thereof (e.g., a stack of Ti/Cu/Ni/Au thin films).

A next step in the solder bump formation process includes transferring the preformed solder balls 30 and 50 to the respective contact pads 62 and 64 of the semiconductor substrate 60 using a standard solder reflow process. With this process, the preformed solder balls 30 and 50 are heated using one of a variety of standard solder reflow techniques, e.g., using a belt reflow tool, or a programmable hot plate. When the preformed solder balls 30 and 50 begin to melt during the initial phase of the solder reflow process, the preformed solder balls 30 and 50 become molten, and the molten solder balls 30 and 50 start wetting, spreading on, and bonding to, the respective contact pads 62 and 64.

In one embodiment of the invention, the solder ball fixture 10 is formed of a material which has a CTE (coefficient of thermal expansion) that is matched to a CTE of the material forming the semiconductor substrate 60. The matching of the CTEs of the solder ball fixture 10 and the semiconductor substrate 60 ensures that the solder ball fixture 10 and the semiconductor substrate 60 expand at the same rate during the solder reflow process so that the preformed solder balls 30 and 50 (which are disposed within the cavities of the fixture 10) are maintained in alignment to the respective contact pads 62 and 64 formed on the surface of the semiconductor substrate 60. On the other hand, the first and second solder ball masks 20 and 40 do not have to be CTE matched to the solder ball fixture 10 because the solder ball placement steps (e.g., FIGS. 2 and 5) are performed at room temperature.

In one embodiment of the invention, a vapor phase flux, such as formic acid, is used during the solder reflow process (as opposed to a liquid type flux). The use of a vapor phase flux such as formic acid enables the removal of Sn oxide during the solder reflow process, while eliminating the creation of flux residues that would otherwise be generated with a liquid type flux. By using a vapor phase flux such as formic acid, no flux residues are generated and no cleaning of flux residue is required. Therefore, after solder reflow, a next phase in the fabrication process can be performed without having to perform a flux residue cleaning process.

Figure 11:
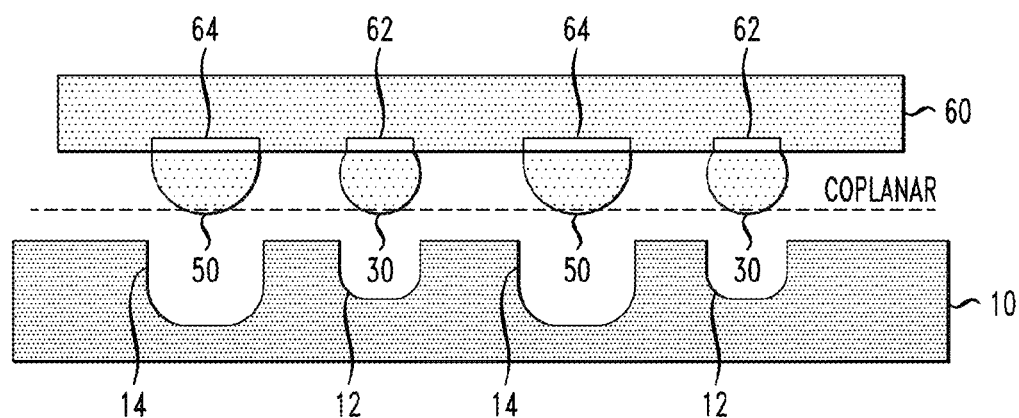

FIG. 11 schematically illustrates a next stage in the solder bump formation process according to an embodiment of the invention, wherein the solder ball fixture 10 is removed from the semiconductor substrate 60 with the preformed solder balls 30 and 50 bonded to the respective contact pads 62 and 64 of the substrate 60 to forming a solder-bumped substrate 60. As shown in FIG. 11, since the larger size preformed solder balls 50 are bonded to the larger surface area contact pads 64, the solder ball bumps 30 and 50 as bonded to the contact pads 62 and 64 maintain coplanarity.

Following the solder bump formation process, the substrate 60 can be diced into individual chips or dies using a wafer dicing tool/process, and the individual chips can be flip-chip mounted to one or more package substrates or chip carrier substrates using a standard a flip-chip assembly process. In general, wafer dicing involves mounting a wafer (which comprises a plurality individual dies formed thereon) on a cutting ring, stretching wafer tape over back of the wafer, mounting the wafer on a dicing chuck, and cutting the wafer into individual dies using a diamond blade. With the wafer dicing process, the wafer is cut into individual dies without cutting through the wafer tape so that the individual dies remain attached to the wafer tape after the dicing process. Following wafer dicing, a pick and place machine (semi-automated or fully automated) is used to lift an individual die from the wafer tape (via a vacuum collet), and place the die onto a substrate, package, or other die stack, for example. With an automated pick and place tool, the X and Y positioning is performed automatically using a pattern recognition system, for example.

Figure 12:
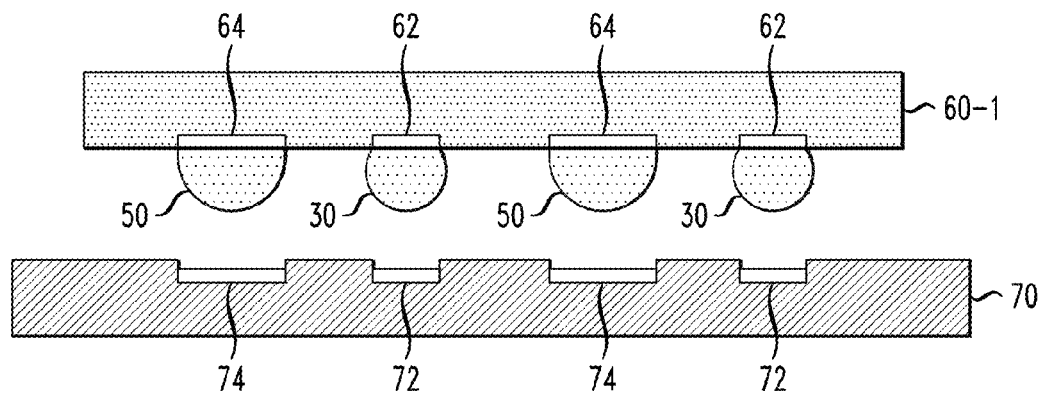
Figure 13:
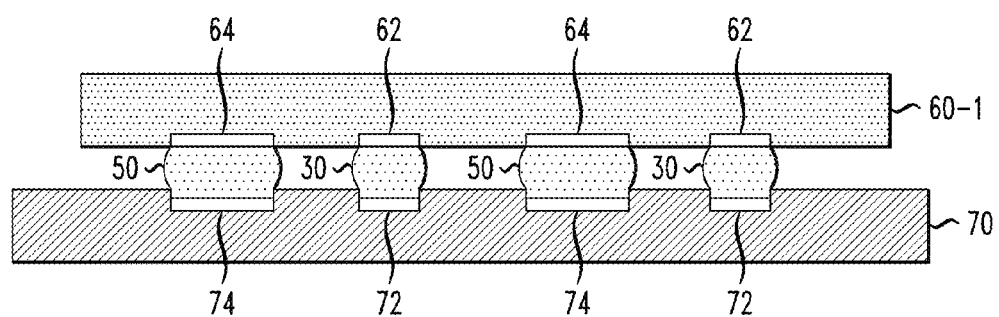
Figure 14:
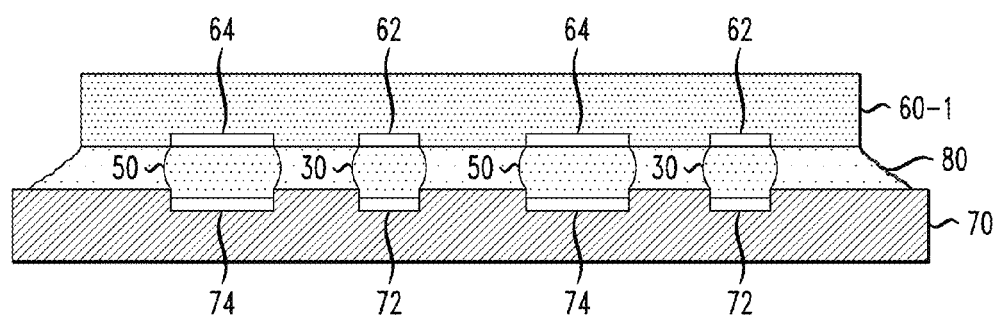

FIGS. 12, 13 and 14 schematically illustrate a flip-chip bonding process which can be implemented to bond an individual die 60-1 (which is diced from the solder bumped semiconductor substrate 60 of FIG. 11) to a package substrate 70. In particular, FIG. 12 shows an initial step of the flip-chip bonding process in which the individual die 60-1 comprises a plurality of the solder bumps 30 and 50 aligned to respective bonding sites 72 and 74 on the package substrate 70. In one embodiment of the invention, this step is performed using any standard pick and place tool/process for flip-chip technologies following a wafer dicing process. In alternate embodiments of the invention, the package substrate 70 may comprises an organic substrate, a silicon substrate, a glass substrate, etc., depending on the package structure being fabricated. The bonding sites 72 and 74 can be formed using known techniques, such as UBM, BLM, etc., depending on the material of the package substrate 70.

FIG. 13 shows a next step of the flip-chip bonding process in which the solder bumps 30 and 50 of the individual die 60-1 are heated and reflowed using a standard reflow process to bond to the respective bonding sites 72 and 74 on the package substrate 70 and form interconnects between the die 60-1 and the package substrate 70. FIG. 14 shows a next step of the flip-chip bonding process in which an underfill material 80 is inserted into the spaces between the die 60-1 and the package substrate 70 using known techniques and materials. The underfill material 80 serves to encapsulate the solder bumps 30 and 50 for the purpose of, e.g., increasing the mechanical integrity and reliability of the solder bump interconnects, as is known in the art.

Figure 15:
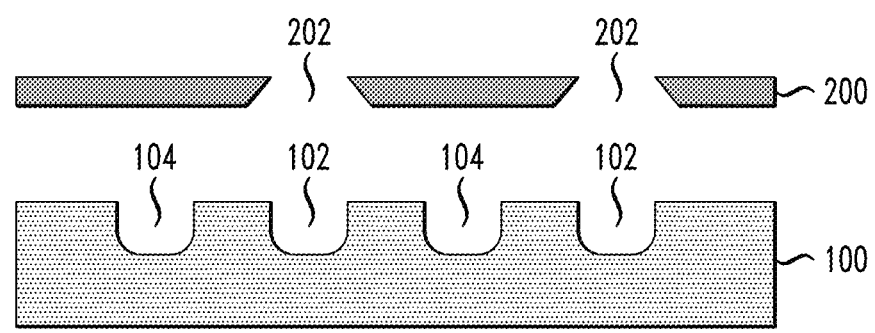

FIGS. 15-21 schematically illustrate a method to form solder bumps on a substrate (e.g., a semiconductor wafer or some other wafer-scale substrate) using preformed solder balls having different compositions, according to another embodiment of the invention. In particular, FIG. 15 schematically illustrates an initial stage of the solder bump formation process wherein a first solder ball mask 200 is aligned to a solder ball fixture 100

FIG. 15 illustrates an initial stage of the process which includes obtaining a solder ball fixture 100 and a first solder ball mask 200. The solder ball fixture 100 comprises a planar substrate having a first array of cavities 102 and a second array of cavities 104 formed in a surface of the substrate to temporarily hold preformed solder balls of different composition types. In the embodiment of FIG. 15, the cavities 102 and 104 are the same size (e.g., same diameter and same depth). The first solder ball mask 200 comprises an array of openings 202 (or through holes) which correspond to the array of cavities 102 of the solder ball fixture 100. The openings 202 shown in FIG. 1 have slanted sidewalls, forming v-shaped openings 202 with a smallest diameter that is substantially the same as the diameter of the cavities 102. The solder ball fixture 100 and the first solder ball mask 200 can be formed of the same or similar materials as discussed above with reference to FIG. 1.

Figure 16:
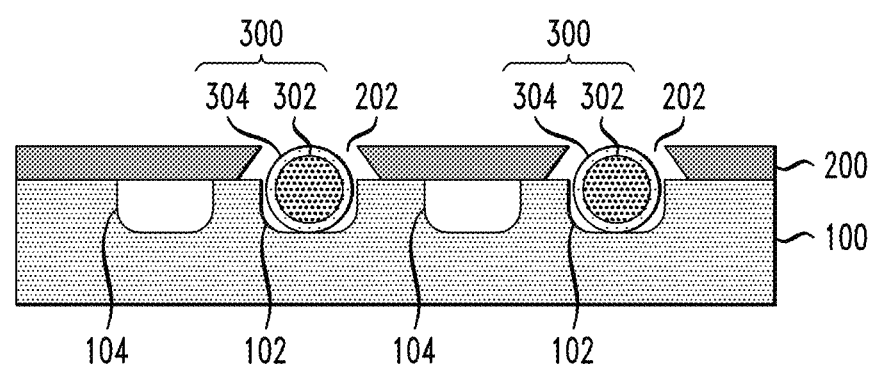

FIG. 16 schematically illustrates a next stage in the solder bump formation process, wherein the first solder ball mask 200 is placed on top of the solder ball fixture 100 and utilized to place preformed solder balls 300 of a first composition type into a first array of cavities 102 of the solder ball fixture 100. In particular, as shown in FIG. 16, the first solder ball mask 200 is placed on top of the solder ball fixture 100 with the array of openings 202 aligned to the array of cavities 102, and wherein an array of the preformed solder balls 300 of a first composition type are placed into the array of cavities 102 through the openings 202 of the first solder ball mask 200 using the same or similar techniques as discussed above with reference to FIG. 2. In one embodiment of the invention, as shown in FIG. 16, the preformed solder balls 300 comprise a copper core 302 encapsulated in electroplated solder 304. The use of the preformed solder balls 300 with the copper core 302 allows for the formation of solder bump connections with lower resistivity and lower electromigration characteristics. As such, the preformed solder balls 300 with copper cores 302 are optimal to form solder bump connections that can handle high power or high current density.

Figure 17:
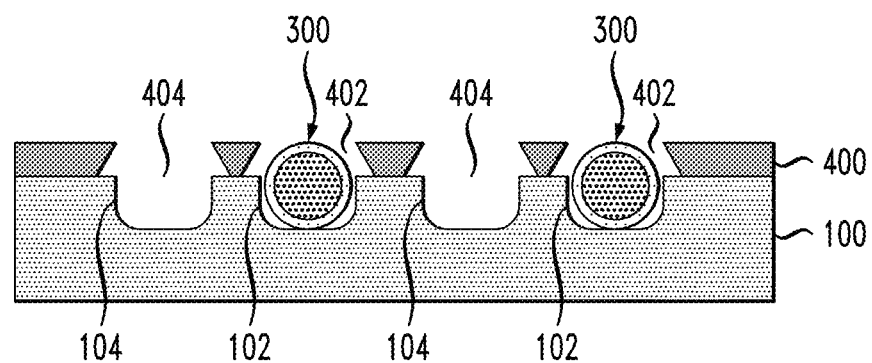

FIG. 17 schematically illustrates a next stage in the solder bump formation process according to an embodiment of the invention, wherein the first solder ball mask 200 is removed, and a second solder ball mask 400 is placed on the solder ball fixture 100. The second solder ball mask 400 comprises an array of openings 404 (or through holes) which correspond to the array of cavities 104 of the solder ball fixture 100, as well as an array of openings 402 which correspond to the array of cavities 102 of the solder ball fixture 100. In this process, the second solder ball mask 400 is placed on top of the solder ball fixture 100 with the array of openings 404 aligned to the array of cavities 104, and with the array of openings 402 aligned to the array of cavities 102 which have the array of preformed solder balls 300 disposed therein In one embodiment, the array of openings 402 are formed to provide room for the upper portions of the preformed solder balls 300 which extend past the surface of the fixture 100, and thereby allow the second solder ball mask 400 to lay flat on the solder ball fixture 100. In another embodiment of the invention, the second solder ball mask 400 may comprises partially etched regions (as opposed to through-hole openings 402) to provide room for the upper portions of the preformed solder balls 300 which extend past the surface of the fixture 100 (e.g., similar to the partially etched regions 42', FIGS. 7 and 8).

Figure 18:
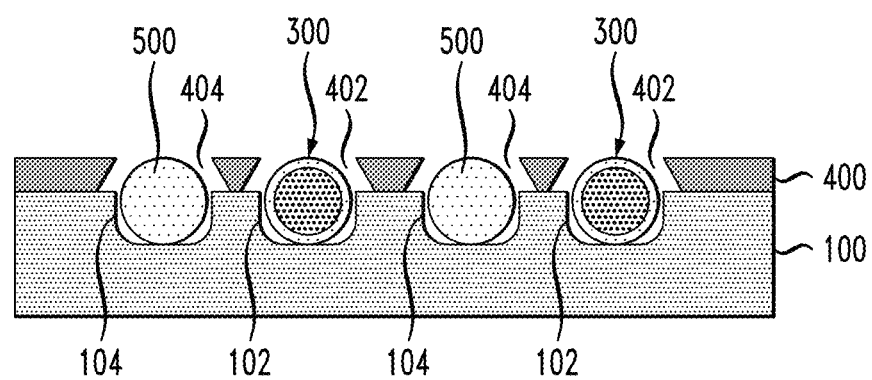

The array of openings 404 allow preformed solder balls of a second composition type to be placed into the cavities 104 of the solder ball fixture 100. In particular, FIG. 18 schematically illustrates a next stage in the solder bump formation process, wherein the second solder ball mask 400 is utilized to place preformed solder balls 500 of a second composition type into the second array of cavities 104 of the solder ball fixture 100 through the openings 404 of the second solder ball mask 400 using the same techniques as discussed above. In one embodiment of the invention, the preformed solder balls 500 differ in composition from the preformed solder balls 300 in that the preformed solder balls 500 do not include copper cores, but are formed entirely of solder material. In other embodiments of the invention, the preformed solder balls 300 and the preformed solder balls 500 can be formed entirely of solder, but with different compositions of solder which are optimized for the given application.

Figure 19:
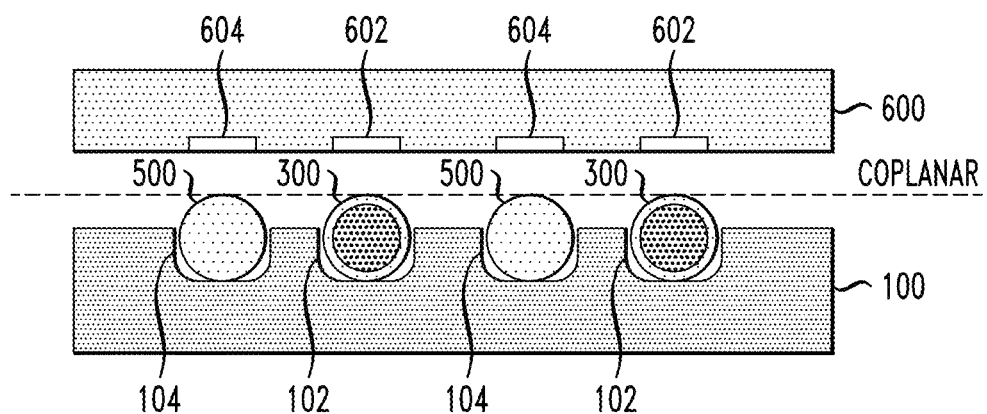
Figure 20:
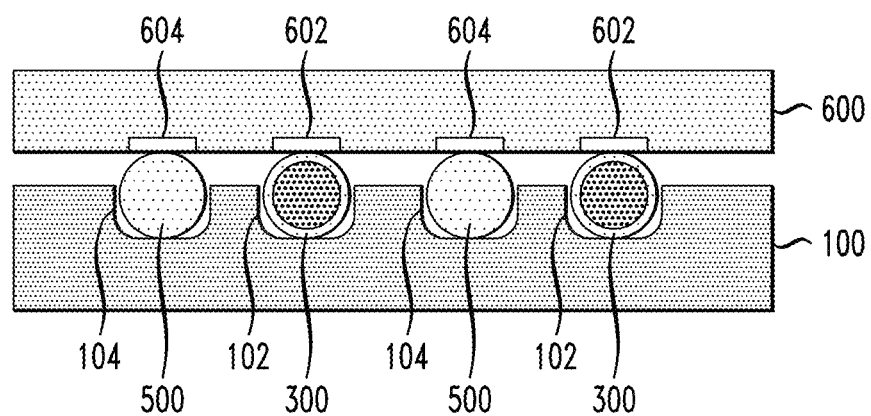
Figure 21:
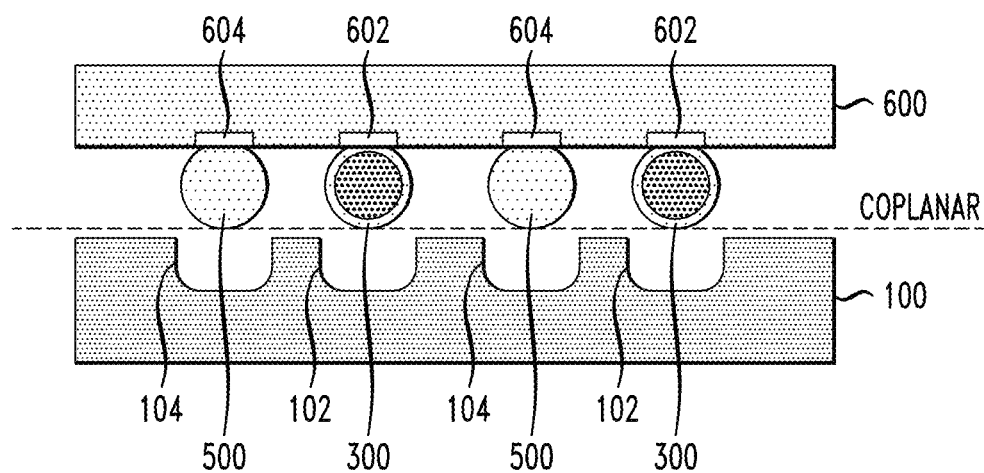

FIGS. 19, 20, and 21 schematically illustrate a next stage in the solder bump formation process according to an embodiment of the invention, wherein the preformed solder balls 300 and 500 are transferred (i.e., bonded) to contact pads of a semiconductor substrate. In particular, FIG. 19 schematically illustrates a next stage in the solder bump formation process, wherein the second solder ball mask 400 is removed from the surface of the solder ball fixture 100, leaving the array of preformed solder balls 300 and 500 disposed in the respective cavities 102 and 104, and wherein a first array of contact pads 602 and a second array of contact pads 604 of a semiconductor substrate 600 (e.g., silicon wafer, or some other wafer-scale substrate) are aligned to the respective arrays of the first and second composition types of the preformed solder balls 300 and 500 in the solder ball fixture 100. In addition, FIG. 20 schematically illustrates a next stage in the solder bump formation process, wherein the semiconductor substrate 600 is placed on top of the solder ball fixture 100 with the contact pads 602 and 604 in contact with corresponding preformed solder balls 300 and 500 to begin a solder reflow process.

More specifically, as shown in FIG. 20, the first array of contact pads 602 is aligned to the array of the preformed solder balls 300 within the cavities 102 of the fixture 100, while the second array of contact pads 604 is aligned to the array of the preformed solder balls 500 within the cavities 104 of the fixture 100. In one embodiment of the invention, since the preformed solder balls 300 and 500 are similar in size, the surface area of the contact pads 602 and 604 are the same. As further shown in FIGS. 19 and 20, the coplanarity of the preformed solder balls 300 and 500 across the array of preformed solder balls arranged in the fixture 100 allows the contact pads 602 and 604 of the substrate 600 to made contact to each of the respective preformed solder balls 300 and 500. In one embodiment of the invention, the contact pads 602 and 604 comprise UBM structures that are formed using a standard BLM process, such as discussed above.

FIG. 21 schematically illustrates a next step in the solder bump formation process, wherein the preformed solder balls 300 and 500 are transferred to respective contact pads 602 and 604 of the semiconductor substrate 600 using a standard solder reflow process, such as discussed above with reference to FIG. 11. In one embodiment of the invention, the solder ball fixture 100 is formed of a material which has a CTE that is matched to a CTE of the material forming the semiconductor substrate 600, which ensures that the solder ball fixture 100 and the semiconductor substrate 600 expand at the same rate during the solder reflow process so that the preformed solder balls 300 and 500 (which are disposed within the cavities of the fixture 100) are maintained in alignment to the respective contact pads 602 and 604 formed on the surface of the semiconductor substrate 600. As further shown in FIG. 21, after the solder reflow process, the solder ball fixture 100 is removed from the semiconductor substrate 600 with the preformed solder balls 300 and 500 bonded to the respective contact pads 602 and 604 of the substrate 600, thereby forming a solder-bumped substrate 600. The process is configured to ensure that the solder bumps 300 and 500 as formed on the contact pads 602 and 604 maintain coplanarity.

Figure 22:
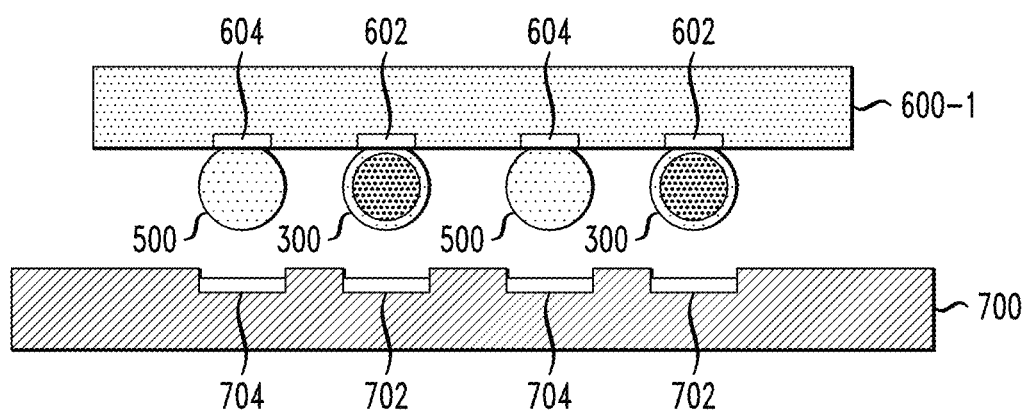
Figure 23:
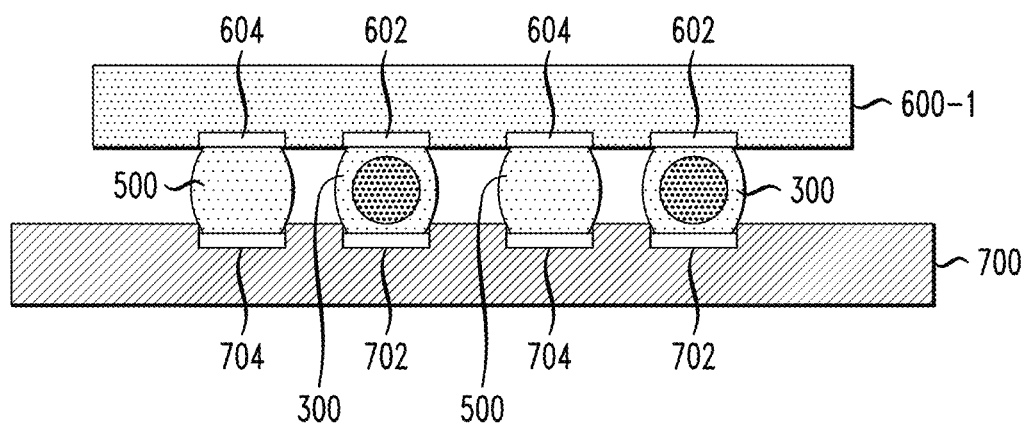
Figure 24:
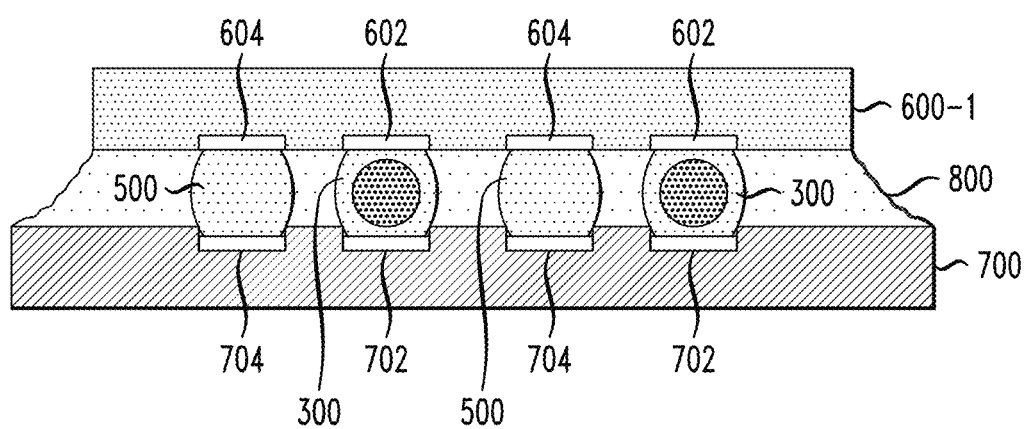

FIGS. 22, 23, and 24 schematically illustrate a flip-chip bonding process which can be implemented to bond an individual die 600-1 (which is diced from the solder bumped semiconductor substrate 600 of FIG. 21) to a package substrate 700. In particular, FIG. 22 shows an initial step of the flip-chip bonding process in which the solder bumps 300 and 500 of the individual die 600-1 are aligned to respective bonding sites 702 and 704 on the package substrate 700. FIG. 23 schematically illustrates a next step of the flip-chip bonding process in which the solder bumps 300 and 500 of the individual die 600-1 are heated and reflowed using a standard reflow process to bond to the respective bonding sites 702 and 704 on the package substrate 700 and form interconnects between the die 600-1 and the package substrate 700. FIG. 24 schematically illustrates a next step of the flip-chip bonding process in which an underfill material 800 is inserted into the spaces between the die 600-1 and the package substrate 700 using known techniques and materials.

It is to be understood that while the example embodiments shown in the Figures illustrate the use of two solder ball masks, three or more solder masks can be utilized to arrange preformed solder balls in a solder ball fixture for applications in which it is desirable to form a solder-bumped substrate using three or more different sized and/or different composition preformed solder balls. It is to be further understood that the methods discussed herein can be incorporated in various process flows to form solder bumps with different compositions and/or different sizes (e.g., volumes) on substrates such as semiconductor wafers, which have multiple die sites comprising integrated circuitry (e.g., analog and digital circuitry or mixed-signal circuitry). The integrated circuit dies can be fabricated with various devices such as FinFET devices, bipolar transistors, metal-oxide-semiconductor transistors, diodes, capacitors, inductors, etc. An integrated circuit in accordance with the present invention can be employed in various applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method to form solder bumps on a substrate, comprising:
    placing a first solder ball mask on a solder ball fixture, wherein the solder ball fixture comprises a first array of cavities and a second array of cavities formed in a surface of the solder ball fixture, wherein the first solder ball mask comprises a first array of openings aligned to the first array of cavities of the solder ball fixture;
    utilizing the first solder ball mask to place a first set of preformed solder balls into the first array of cavities through the first array of openings, wherein the first solder ball mask prevents the first set of preformed solder balls from being placed into the second array of cavities of the solder ball fixture;
    removing the first solder ball mask from the solder ball fixture, and placing a second solder ball mask on the solder ball fixture, wherein the second solder ball mask comprises a second array of openings aligned to the second array of cavities of the solder ball fixture;
    utilizing the second solder ball mask to place a second set of preformed solder balls into the second array of cavities through the second array of openings;
    removing the second solder ball mask from the solder ball fixture;
    placing a substrate on the solder ball fixture, wherein the substrate comprises a first array of contact pads aligned to, and in contact with, the first set of preformed solder balls disposed in the first array of cavities of the solder ball fixture, and wherein the substrate comprises a second array of contact pads aligned to, and in contact with, the second set of preformed solder balls disposed in the second array of cavities of the solder ball fixture:
    performing a solder reflow process while the substrate is placed on the solder ball fixture to heat the preformed solder balls and bond the first set of preformed solder balls to the first array of contact pads of the substrate and bond the second set of preformed solder balls to the second array of contact pads of the substrate; and
    removing the solder ball fixture from the semiconductor substrate after the solder reflow process is completed;
    wherein the first and second sets of preformed solder balls differ in size, wherein the preformed solder balls of the first set of preformed solder balls have a diameter D1, wherein the preformed solder balls of the second set of preformed solder balls have a diameter D2, wherein D2 is greater than D1; and
    wherein the first array of cavities and the second array of cavities formed in the surface of the solder ball fixture are sized and shaped such that top portions of each of the first and second sets of preformed solder balls, which protrude from the first and second arrays of cavities past the surface of the solder ball fixture, are coplanar.

2. The method of claim 1, wherein the first array of openings of the first solder mask and the first array of cavities of the solder ball fixture are sized and shaped to allow the first set of preformed solder balls to pass through the first array of openings and fit within the first array of cavities, and wherein the second array of openings of the second solder mask and the second array of cavities of the solder ball fixture are sized and shaped to allow the second set of preformed solder balls to pass through the second array of openings and fit within the second array of cavities.

3. The method of claim 1, wherein a surface area of each contact pad of the first array of contact pads is less than a surface area of each contact pad of the second array of contact pads.

4. The method of claim 1, wherein the first and second sets of preformed solder balls differ in composition, wherein the first set of preformed solder balls have a first composition type, and wherein the second set of preformed solder balls have a second composition type.

5. The method of claim 4, wherein at least one of the first composition type and the second composition type comprises a preformed solder ball comprising a copper core with electroplated solder covering the copper core.

6. The method of claim 1, wherein the substrate comprises a semiconductor wafer.

7. The method of claim 1, wherein the solder ball fixture has a CTE (coefficient of thermal expansion) that is matched to a CTE of the substrate.

* * * * *